(12) United States Patent
Mastrangelo et al.

(10) Patent No.: US 6,494,433 B2
(45) Date of Patent: Dec. 17, 2002

(54) THERMALLY ACTIVATED POLYMER DEVICE

(75) Inventors: Carlos H. Mastrangelo, Ann Arbor, MI (US); Edwin T. Carlen, Cambridge, MA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/874,927

(22) Filed: Jun. 5, 2001

(65) Prior Publication Data

US 2002/0037221 A1 Mar. 28, 2002

Related U.S. Application Data

(60) Provisional application No. 60/209,749, filed on Jun. 6, 2000.

(51) Int. Cl.[7] ............................................. F16K 31/64
(52) U.S. Cl. ........................ 251/11; 251/331; 251/368
(58) Field of Search ............................ 257/11, 331, 368

(56) References Cited

U.S. PATENT DOCUMENTS

| | | | |
|---|---|---|---|
| 4,581,624 A | | 4/1986 | O'Connor |
| 4,711,270 A | | 12/1987 | Fornasari |
| 4,821,997 A | * | 4/1989 | Zdeblick ...................... 251/11 |
| 4,997,521 A | | 3/1991 | Howe et al. |
| 5,058,856 A | * | 10/1991 | Gordon et al. ................. 251/11 |
| 5,069,419 A | | 12/1991 | Jerman |
| 5,271,597 A | | 12/1993 | Jerman |
| 5,322,258 A | | 6/1994 | Bosch et al. |
| 5,323,999 A | * | 6/1994 | Bonne et al. ................. 251/331 |
| 5,333,831 A | * | 8/1994 | Barth et al. .................. 251/368 |
| 5,452,878 A | | 9/1995 | Gravesen et al. |
| 5,454,146 A | | 10/1995 | Yagi et al. |
| 5,720,169 A | | 2/1998 | Schneider |
| 5,771,902 A | | 6/1998 | Lee et al. |
| 5,785,295 A | | 7/1998 | Tsai |
| 5,954,079 A | | 9/1999 | Barth et al. |
| 6,070,851 A | * | 6/2000 | Tsai et al. .................... 251/368 |
| 6,087,638 A | * | 7/2000 | Silverbrook .................. 251/11 |
| 6,129,331 A | * | 10/2000 | Henning et al. ............... 251/11 |
| 6,131,879 A | * | 10/2000 | Kluge et al. .................. 251/11 |

OTHER PUBLICATIONS

"Design and Implementation of a Paraffin Based Micropositioning Actuator", David E. Dowen—Starsys Research Corporation, SPIE, vol. 3132, 1997, p. 127–134.

"Paraffin Actuated Surface Micromachined Valves", E.T. Carlen and C.H. Mastrangelo, The University of Michigan, Ann Arbor, MI., Presented At The IEEE Micro Electro Mechanical Systems 2000 Conference, Miyazaki, Japan, Jan. 23–27, 2000, p. 1–5.

"Simple, High Actuation Power, Thermally Activated Paraffin Microactuator", E.T. Carlen and C.H. Mastrangelo, The University of Michigan, Ann Arbor, MI., Presented At The Transducers '99 Conference, Sendai, Japan, Jun. 7–10, 1999, p. 1–4.

(List continued on next page.)

Primary Examiner—Henry C. Yuen
Assistant Examiner—John Bastianelli
(74) Attorney, Agent, or Firm—Harness, Dickey & Pierce, P.L.C.

(57) ABSTRACT

A microfluidic device adapted for use with a power source is disclosed. The device includes a substrate and a heater member. The substrate and heater member form a first portion. A second portion is formed adjacent to the first portion. The second portion includes a high activating power polymer portion, at least one resin layer and a shield member. The second portion is selectively shaped to form a thermal expansion portion. A diaphragm member encapsulates the thermal expansion portion so that when power is applied to the heater portion, the high activating power polymer expands against the diaphragm member, causing the diaphragm member to deflect. This device is adapted for use as a microactuator or a blocking microvalve.

40 Claims, 8 Drawing Sheets

OTHER PUBLICATIONS

"Thermal–Expansion–Type Microactuator with Paraffin as the Expansive Material* (Basic Performance of a Prototype Linear Actuator)", N. Kabei, M. Kosuda, H. Kagamibuchi, R. Tashiro, H. Mizuno, Y. Ueda and K. Tsuchiya, JSME International Journal, Series C., vol. 40, No. 4, 1997, p. 736–742.

"Thermally– and Phase Transformation–Induced Volume Change of Polymers for Actuator Applications", B.Z. Jang and Z.J. Zhang, Journal of Intelligent Material Systems and Structures, vol. 5, Nov. 1994, p. 758–763.

* cited by examiner

THERMALLY ACTIVATED POLYMER DEVICE

STATEMENT OF GOVERNMENTAL SUPPORT

This invention was made with Government support under Grant No. F30602-98-2-0197 awarded by the Defense Advanced Research Projects Agency. The Government has certain rights in this invention.

BACKGROUND OF THE INVENTION

The present invention relates to microdevices and, in particular, to a microdevice using a high molecular weight polymer to deflect a membrane.

In the past decade many low voltage electromechanical microactuators based on electrostatic, magnetic, bimorph, thermopneumatic, and shape-memory forces have been developed. A parameter that characterizes the ability of an electromechanical actuator to exert work on a load is its actuation energy. Actuation energy is defined as the product of actuator force times minimum displacement. Preferably, actuators can be scaled and operate under various conditions. A more suitable parameter, energy density $P_a$, is the actuation energy divided by the total actuator volume, when the actuator is operated under low voltages.

The table below shows $P_a$ values for several different low voltage microactuators. The majority of these devices can provide either a large deflection without a large force or vice-versa. From Table 1 below, it is clear that electrostatic actuators have the lowest energy density and thermal actuators have the highest energy density. Among these, thermopneumatic microactuators and shape memory alloy (SMA) microactuators develop the largest energy density, $P_a$. These latter two microactuators convert electrical to mechanical work through a high density working substance.

TABLE 1

Energy Density ($P_a$) for several low voltage microactuators

| Actuator Type | Electro-static comb drive | Electro-static par. plate | Magnetic | Thermo Bimorph | Thermo pneumatic | SMA |
|---|---|---|---|---|---|---|
| $P_a$ | $10^2$ | $10^3$ | $10^4$ | $10^5$ | $10^6$ | $10^7$ |

SMAs provide very large forces, but their linear deformation strain is limited to about 8%. Therefore, SMAs often use mechanical advantage schemes to increase displacement. Thermopneumatic actuators provide both large displacements and forces, but their fabrication and integration into large microsystems is often cumbersome. This is due to the difficulty of encapsulating the working substance, typically a liquid, into a sealed cavity.

The working substance in a microactuator, however, can be a solid. A desired general property of a solid working substance is a large thermal expansion range at the solid-liquid phase transition. Typically, this property is found in long chained polymers. Paraffins are long chained polymers which have this large thermal expansion characteristic plus a low transition temperature which is also a desired property. Thus, long chained polymers including paraffins, have the ability to generate very large energy density $P_a$ actuators. Such polymers are hereinafter defined as "high actuating power polymers" or HAPP. Macroscopic paraffin actuators have been developed for many applications including automotive thermostats and more recently in satellite antenna positioning systems and medical devices. As with conventional thermopneumatic actuators, once the polymer melts it transmits pressure, a useful hydraulic property for force and deflection multiplication. These two properties make HAPP actuators particularly attractive for the fabrication of microactuators or simple integrated miniature valves in microfluidic systems.

Over the past decade, elaborate microfluidic valves have also been constructed based on electrostatic, magnetic, piezoelectric, bimorph and thermopneumatic actuation methods. Because of their complexity, the majority of these devices are made by bonding many thick glass or silicon substrates together, some even requiring external cavity fills for the working fluid. This complexity makes for a bulky device and makes these valves large and difficult to integrate with other components in microfluidic systems.

Applications requiring many active microfluidic devices such as valves and actuators on a single die are rapidly emerging. Integrated microgas chromatography and mass spectrometry systems are being developed which require effective microdevices. In addition, microfluidic systems, such as DNA analysis systems, require microvalves in order to control the transport of samples and reagents throughout different parts of the system. Typically these systems require many, independently operating microvalves and microactuators in order to perform complex or parallel functions.

Therefore, what is needed is a microfluidic device that uses a high actuating power polymer and which overcomes the above disadvantages. Specifically, a microdevice is needed that uses simple micromachining fabrication techniques to incorporate a high actuating power polymer that can be patterned using micromachining techniques without requiring any working fluid filling or post-processing sealing operations. Additionally, a microdevice that produces a large deflection and a large force that is easily integrated into microsystems and which can be easily integrated with other fluidic components and that will provide a microdevice which operates independently of other devices, is also desired. It is therefore an object of the present invention to provide a microfluidic device and process for fabricating the device using a high actuating power polymer (HAPP) with these features.

SUMMARY OF THE INVENTION

In accordance with the teachings of the present invention, a high actuating power polymer (HAPP) for use in a microfluidic device and its method of fabrication are disclosed. The HAPP, when melted, undergoes a volumetric expansion and/or a phase change in a constrained volume to produce a large deflection and force which is used to move or control an object.

In one preferred embodiment, a microfluidic device is adapted for use with a power source. The device includes a substrate with a heater member. The substrate and heater member form a first portion. A second portion is adjacent to the first portion. The second portion includes a HAPP portion, at least one resin layer and a shield member. The second portion is selectively shaped to form a thermal expansion portion. A diaphragm member encapsulates the thermal expansion portion so that when power is applied to the heater portion, the HAPP portion expands against the diaphragm member and deflects.

In another preferred embodiment, a process for forming a microfluidic device on a substrate is disclosed. The microfluidic device is adapted for use with a power source. The process includes forming a heater on the substrate. The heater portion and the substrate form a first portion. Then, a second portion adjacent to the first portion is constructed. The second portion includes a HAPP layer, at least one resin layer on the HAPP layer and a mask on the resin layer. Next, the second portion is shaped to form a thermal expansion portion. The thermal expansion portion is encapsulated with a diaphragm so that when power is applied to the heater portion, the HAPP layer expands against the diaphragm member so that the diaphragm member deflects.

It is an object of the present invention to provide a microfluidic device that uses a long chained polymer which, when melted, undergoes a large volumetric expansion and/or phase change in a constrained volume to produce a deflection to form an actuator member.

It is another object of the present invention to provide a microfluidic device that uses HAPP which, when melted, undergoes a large volumetric expansion and/or phase change in a constrained volume to form a blocking microvalve.

It is still another object of the present invention to provide a microfluidic device that uses HAPP which, when melted, undergoes a volumetric expansion and/or phase change in a constrained volume with support posts to produce a large deflection in a membrane which operatively engages an outlet port in a reservoir.

These and other objects of the invention will become apparent from a consideration of the following description and the appended claims when taken in connection with the accompanying drawings.

BRIEF DESCRIPTION OF THE DRAWINGS

Still other advantages of the present invention will become apparent to those skilled in the art after reading the following specification and by reference to the drawings in which.

DESCRIPTION OF THE INVENTION

The following description of the preferred embodiments concern a micromachined device which is adaptable to be operated as an actuator or a blocking microvalve are merely exemplary in nature and are not intended to limit the invention or its application or uses. Moreover, while the present invention is described in detail below generally with respect to an actuator and a blocking microvalve, it will be appreciated by those skilled in the art that the present invention is clearly not limited to only an actuator or a blocking microvalve and may be applied to various other micromachined devices.

Figure 1:
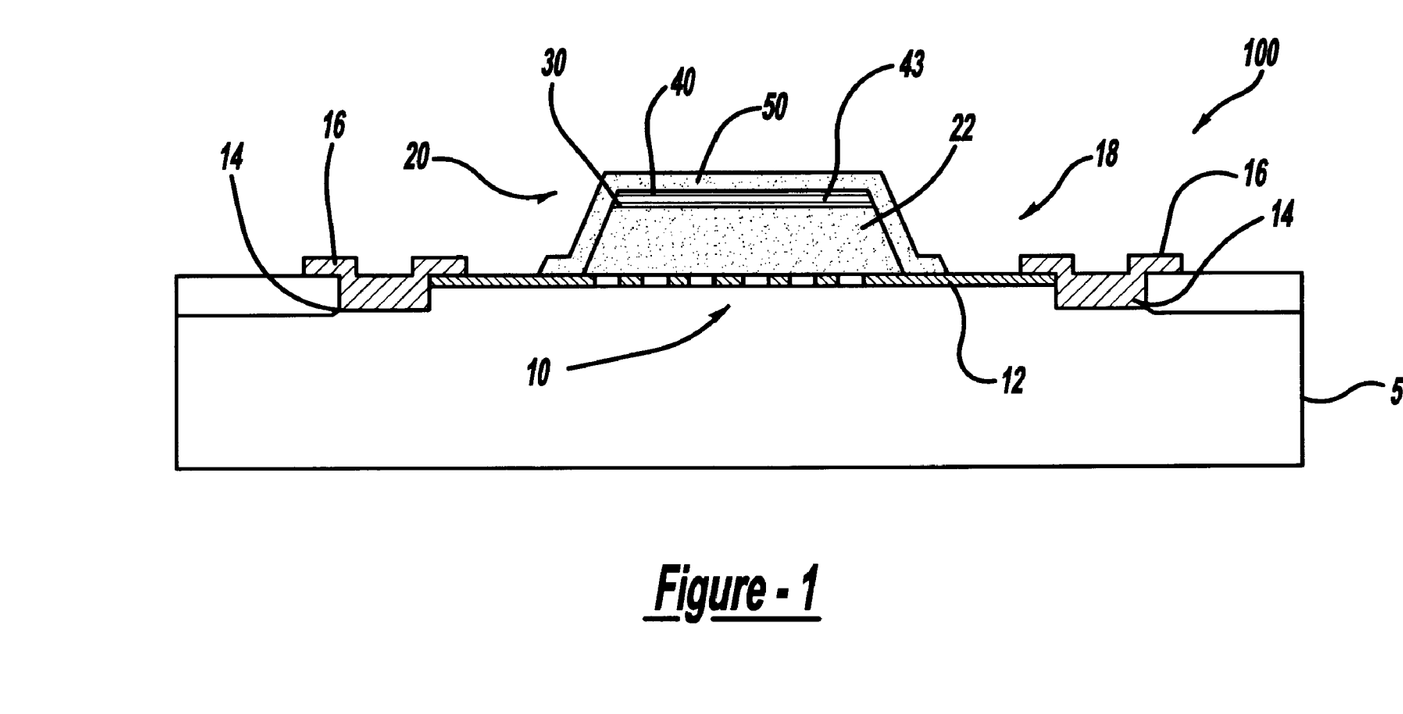
FIG. 1 is a cross sectional view of a micro actuator according to the first preferred embodiment of the invention.
Figure 2:
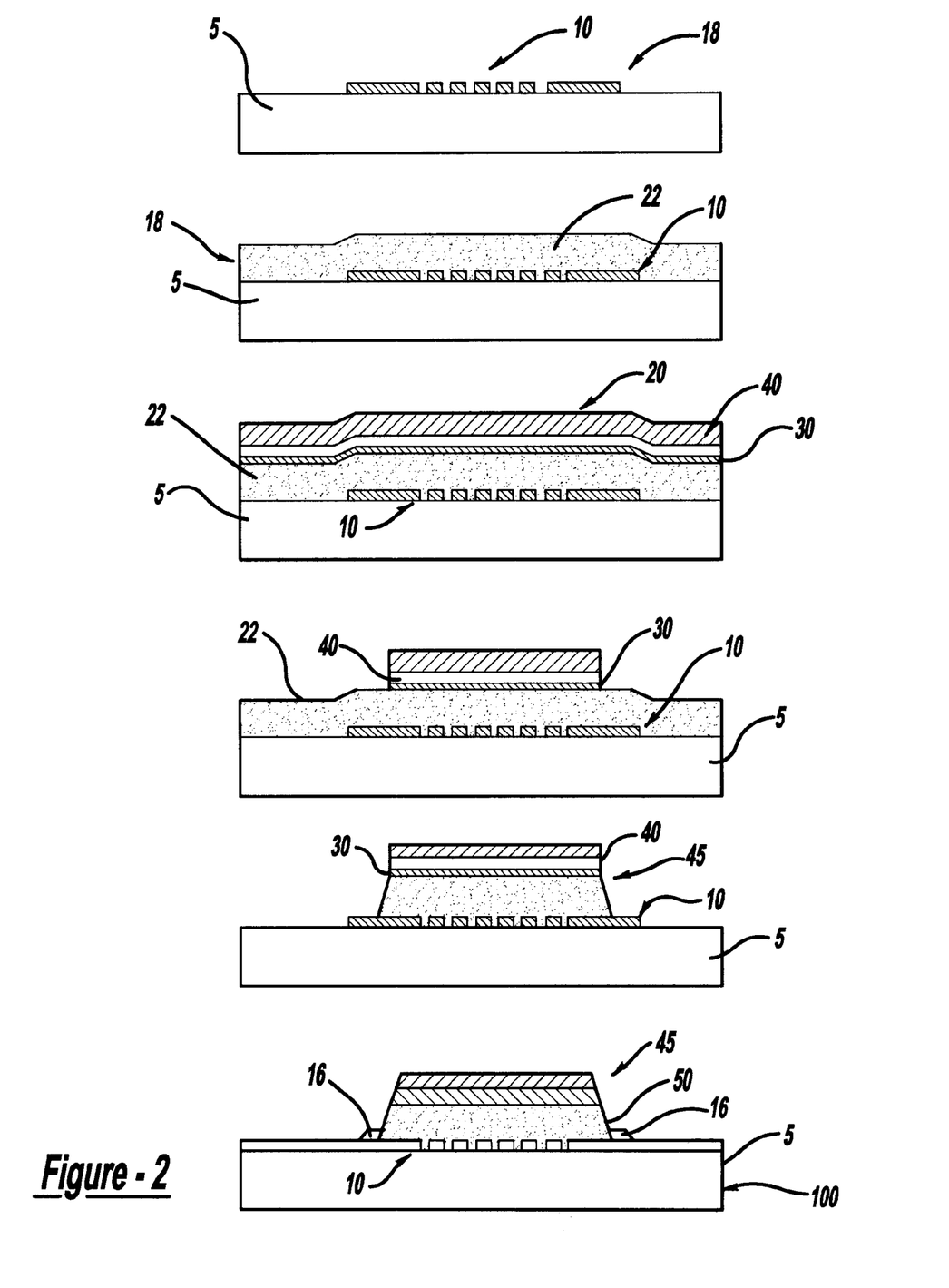
FIG. 2 is a simplified fabrication flow chart of the device in FIG. 1.

Referring to FIGS. 1 and 2, a micromachined device or actuator 100 according to the teachings of the first preferred embodiment of the present invention is shown. The actuator 100 includes a substrate 5, a heater portion 10, a HAPP portion 22, at least one resin layer 30, a shield member 40 and a diaphragm 50.

The substrate 5 includes either a silicone wafer or alternatively, a glass wafer which is photo definable such as, for example, Pyrex® No. 7740. The substrate 5 is cleaned with an appropriate acid mixture, rinsed and dried, as is well known in the art.

The heater portion 10 includes a layer 12 which is preferably a 500/5000 Å thick layer of Chromium/Gold (Cr/Au). Alternatively, the layer 12 may be a layer of aluminum, copper or silver or any other material which is suitable for use in practicing the invention. The layer 12 of Cr/Au is evaporated with an electron beam and patterned or formed onto the cleaned substrate 5. The heater portion 10 and the substrate 5 form a first portion 18.

A second portion 20 is formed on the first portion 18. The second portion 20 includes a HAPP portion 22, at least one sealer or resin layer 30 and a physical mask or shield member 40.

As stated earlier, HAPP as defined herein, is a high actuator power polymer. HAPP is a long chain polymer with a large thermal expansion characteristic at a solid-liquid phase transition. Preferably, HAPP has a low transition temperature at the solid-liquid phase transition such as for example n-Alkanes. Alternatively, HAPP may be a polyethylene or any polymer with a liquid-gaseous phase transition. The n-Alkanes group of organic materials are generally classified as paraffins and includes, for example, n-tetracosane polymers, n-hexatriacontane containing polymers, and n-tetratetracontane polymers. A HAPP portion 22 is evaporated and deposited on the first portion 18 so as to be over the heater portion 10.

The sealer or resin layer 30 is vapor deposited on the HAPP portion 22. Preferably, the sealer or resin layer 30 is a p-xylene thermoplastic generally known as parylene-C and, preferably, it is between 5000–10,000 Å thick.

The shield member 40 is evaporated and deposited on top of the sealer or resin layer 30. Preferably a 300–500 Å to 3000–5000Å thick layer of Cr/Au is evaporated by an electron beam.

A 2.7 $\mu$m thick layer of photoresist, which is available as Microposit SC1827, is spin coated at 4000 rpm for 30 seconds followed by a 2 hour softbake at 60° C. until it is no longer tacky on the Cr/Au layer. The photoresist is then exposed for approximately 45 seconds by a Karl-Suss MA-6 contact aligner and developed in a wet sink using an MF 319 MIF developer for 1 minute. The photoresist is rinsed in de-ionized water for 3 minutes and baked at 60° C. for 60 minutes while ensuring that it is not hardbaked. The patterned photoresist serves as an etch mask.

Next, the Cr/Au layer is wet etched to form a hard physical mask 43. The Au is wet etched in Au etchant for approximately 5 minutes and rinsed with de-ionized water ($DIH_2O$) for 3 minutes. The Cr is also wet etched in Cr etchant for approximately 5 minutes and rinsed with $DIH_2O$ for 3 minutes. The mask 43 is then spun dry. The photoresist is then removed in acetone and $DIH_2O$ for 3 minutes. The substrate is then spun dry The second portion 20 is selectively shaped to form a thermal expansion portion 45. The HAPP portion 22, the sealer 30, and the mask 43 are selectively patterned in $O_2$:$CF_4$ plasma in an Applied Materials 8300 reactor with a water cooled chuck (at 10–17° C.).

A diaphragm member 50 is formed by depositing a 2–4 $\mu$m thick layer of a thermoplastic such as parylene-C over the thermal expansion portion 45. The diaphragm 50 encapsulates the thermal expansion portion 45 to prevent any leakage of HAPP from the thermal expansion portion 45.

A pair of contact holes 14 are formed in the substrate 5 adjacent to the diaphragm member 50 and a pair of contacts 16 are evaporated and patterned into the holes 14. Each contact 16 is connected to an end of the layer 12 of the heater portion 10.

Figure 3:
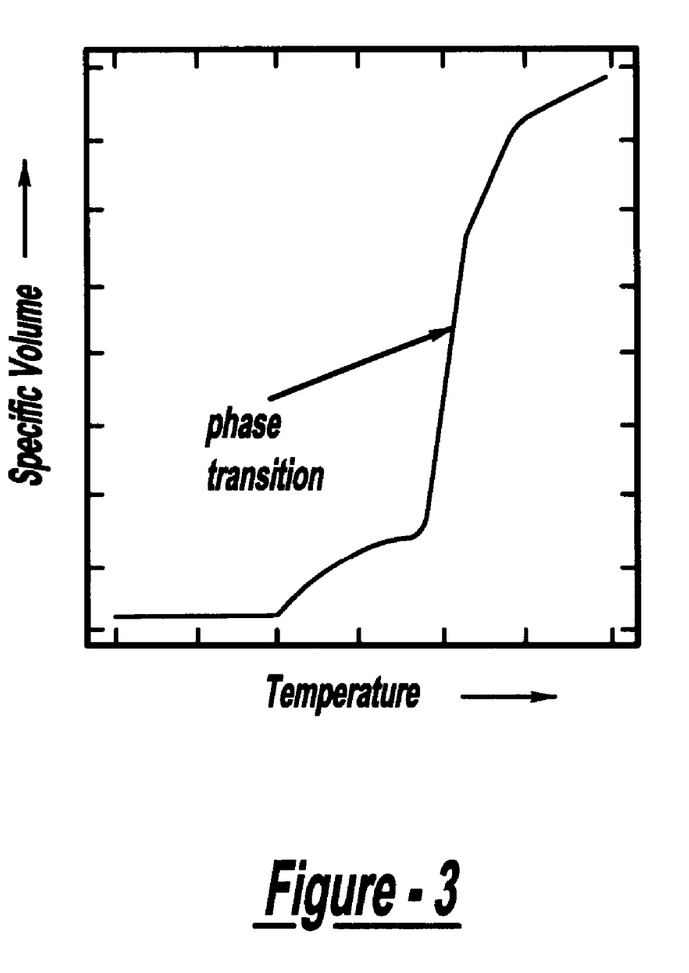
FIG. 3 is a typical relationship of temperature and specific volume for a HAPP material.

In operation, electrical power is connected to each of the pair of contacts 16. As current flows through the layer 12 and produces heat, the heat causes the temperature of the HAPP in the thermal expansion chamber to increase. As the temperature in the HAPP portion 22 reaches its solid-liquid transition temperature, the specific volume of the polymer increases. With further heat input from the layer 12, the HAPP portion 22 undergoes a phase transition. During the phase transition, the specific volume increases dramatically with additional heat from the layer 12 and the diaphragm member 50 causing vertical deflection of the diaphragm member 50. A typical curve showing the relationship of specific volume with temperature for a HAPP material is shown in FIG. 3.

Figure 4:
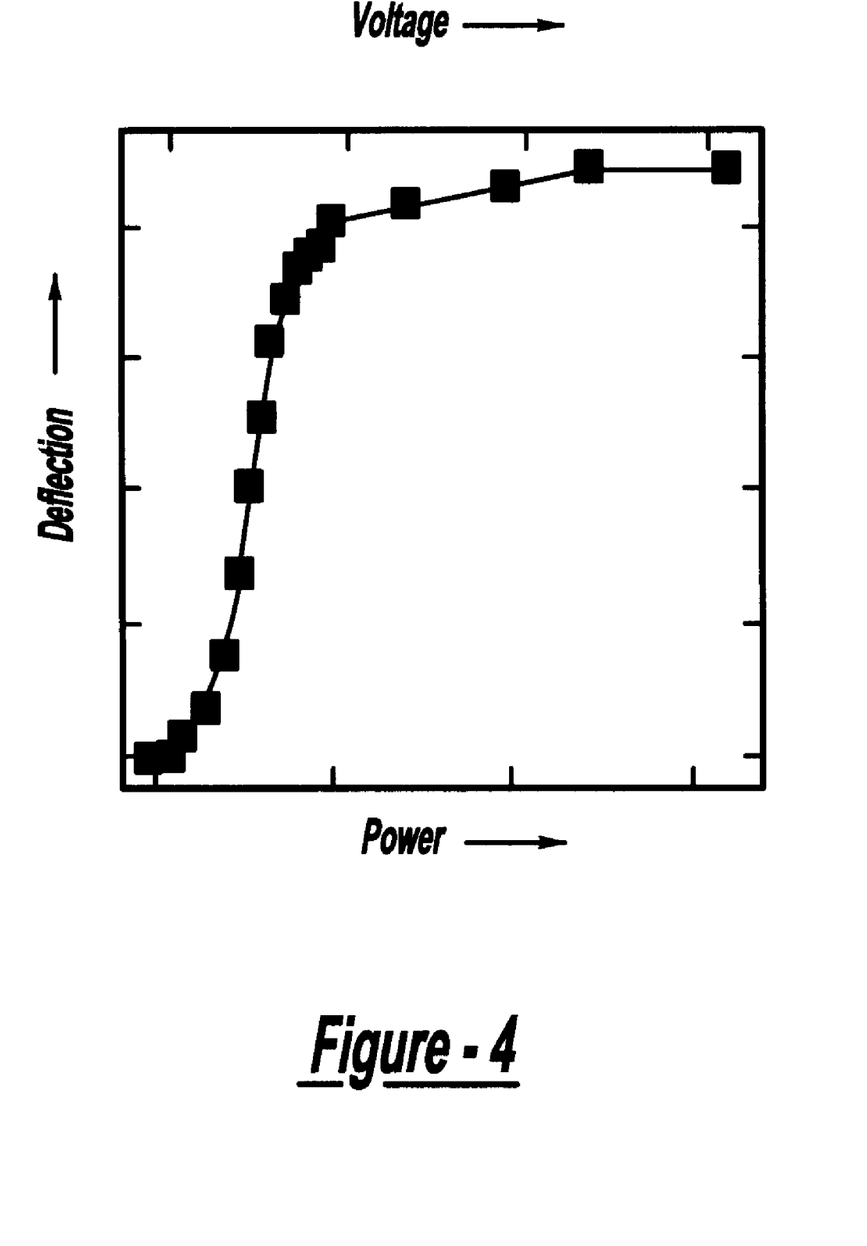
FIG. 4 is a typical relationship of power and deflection of a device according to FIG. 1.

The relationship of specific volume increase with increasing temperature for a HAPP material is utilized by the actuator 100 to act on another object or to close off a fluid port. As shown in FIG. 4, the deflection of the diaphragm 50 increases as power is applied to the heater portion 10. This is because the HAPP portion 22 is confined by the diaphragm member 50. Any increase in the volume of HAPP portion 22 causes the diaphragm member 50 to expand or deflect.

Alternatively, larger deflection distances are possible using thicker HAPP layers, alternative HAPP materials with larger volumetric expansion characteristics or with mechanical advantage mechanisms coupled to the diaphragm member 50.

Figure 5:
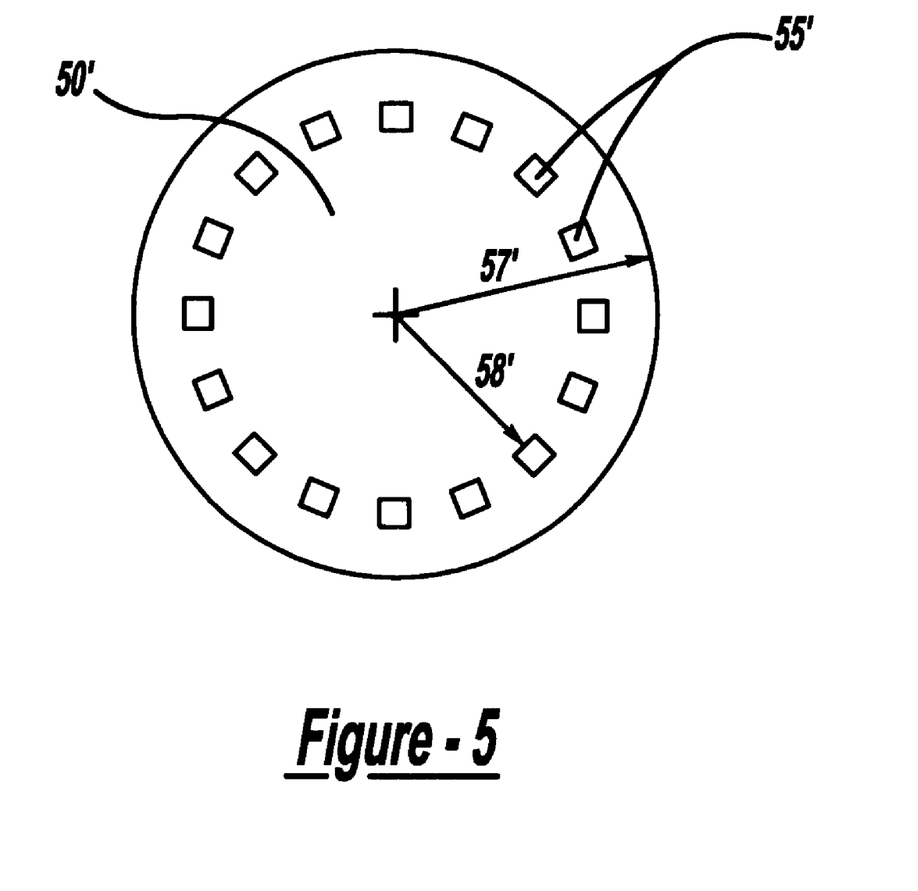
FIG. 5 is a top view of a diaphragm member with posts.

Optionally, the actuator is formed with a modified diaphragm member 50' as shown in FIG. 5. The diaphragm member 50' is preferably round with a center deflection. The deflection of the diaphragm member 50' is increased by rigidly confining the outer portion of the diaphragm member 50' with a plurality of posts 55'. The posts 55' are etched and deposited into the diaphragm member 50'. A larger deflection is achieved with the use of the posts 55' because any volume increase in the HAPP portion is constrained on the edge by the diaphragm member 50'. This causes a larger volume change in the region that is not constrained by the posts 55' or the edge of the diaphragm member 50 . For example, when the diaphragm member 50' has an outer radius 57' and the posts 55' are located on a post radius 58', the deflection of the diaphragm member 50' is magnified by the square of the radius ratio. Thus, where the outer radius 57' is r and the port radius 58' is ½r, the maximum deflection is increased by 4.

Figure 6:
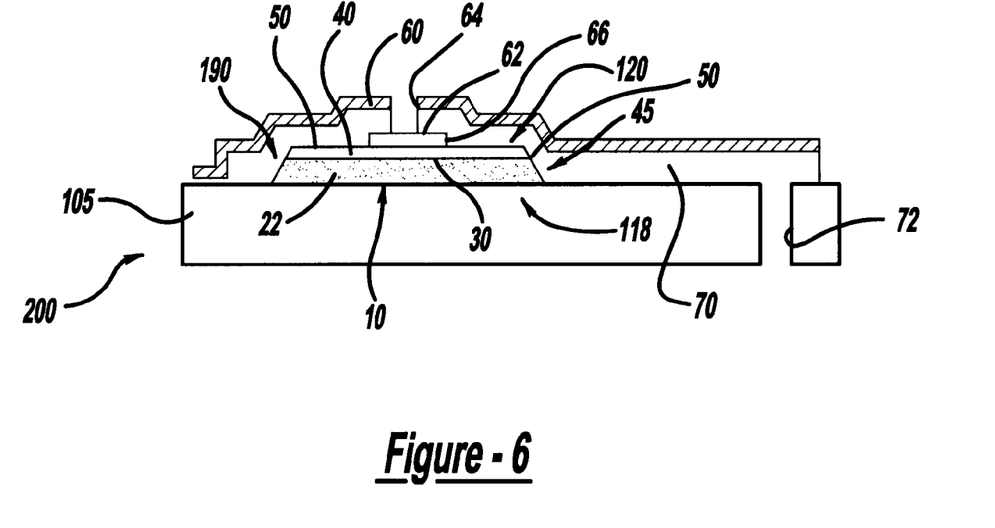
FIG. 6 is a cross sectional view of a microfluidic blocking valve according to the second embodiment of the invention.

In FIG. 6, a second preferred embodiment of a micromachined device adapted for use as a blocking microvalve 200 is shown. Where the elements are the same as in the first preferred embodiment, the numerals are the same. The microvalve 200 includes a substrate 105, a heater portion 10, a HAPP portion 22, at least one resin layer 30, a shield member 40, a membrane member 50, a reservoir 60 and a channel 70. The fabrication process uses a low temperature process of less than 90° C. and includes several lithography stops.

The substrate 105 includes a silicone wafer or a glass wafer The substrate 105 is exposed to ultraviolet light (312 mm at approximately 2 J/cm² energy density for 1 mm thick substrates). This is followed by heat treatment of 600° C. for one hour. During the heat treatment, the substrate surfaces become very rough, requiring surface refinishing. The substrate 105 is planarized with a 20 µm calcinated aluminum slurry, for example, No ØCON-Ø12 obtained from Logitech, Ltd., for one hour and polished with an alkaline colloidal silica slurry, for example, No. SF1 ØCON-140 from Logitech, Ltd., for one hour.

The heater portion 10 is formed on the substrate 105 as was described previously. The heater portion 10 and the substrate 105 form a first portion 118.

A second portion 120 is formed on the first portion 118. The second portion 120 includes a HAPP portion 22, a resin layer 30 and a physical mask or shield member 40.

The second portion 120 is selectively patterned to form a thermal expansion portion 45. The thermal expansion portion 45 is sealed with a 3 µm thick membrane member 50 which is preferably a layer of thermoplastic, such as for example, parylene-C. Adhesion to the physical mask 40 and substrate 105 is assisted by a silanation procedure which is well known in the art. The membrane member 50 is then etched in, for example, an $O_2$ planar reactive ion etching (RIE) apparatus using a 20 µm thick layer of a second resin, such as, for example, photoresist (available from Clariant as No. AZ 9260) and is processed as previously described.

Contact holes 14 are formed in the substrate 105 and a pair of contacts 16 are formed in the holes 14. The contacts 16 are connected to the layer 12 of the heater portion 10 as previously described. Thus, the actuator portion is formed.

Figure 7:
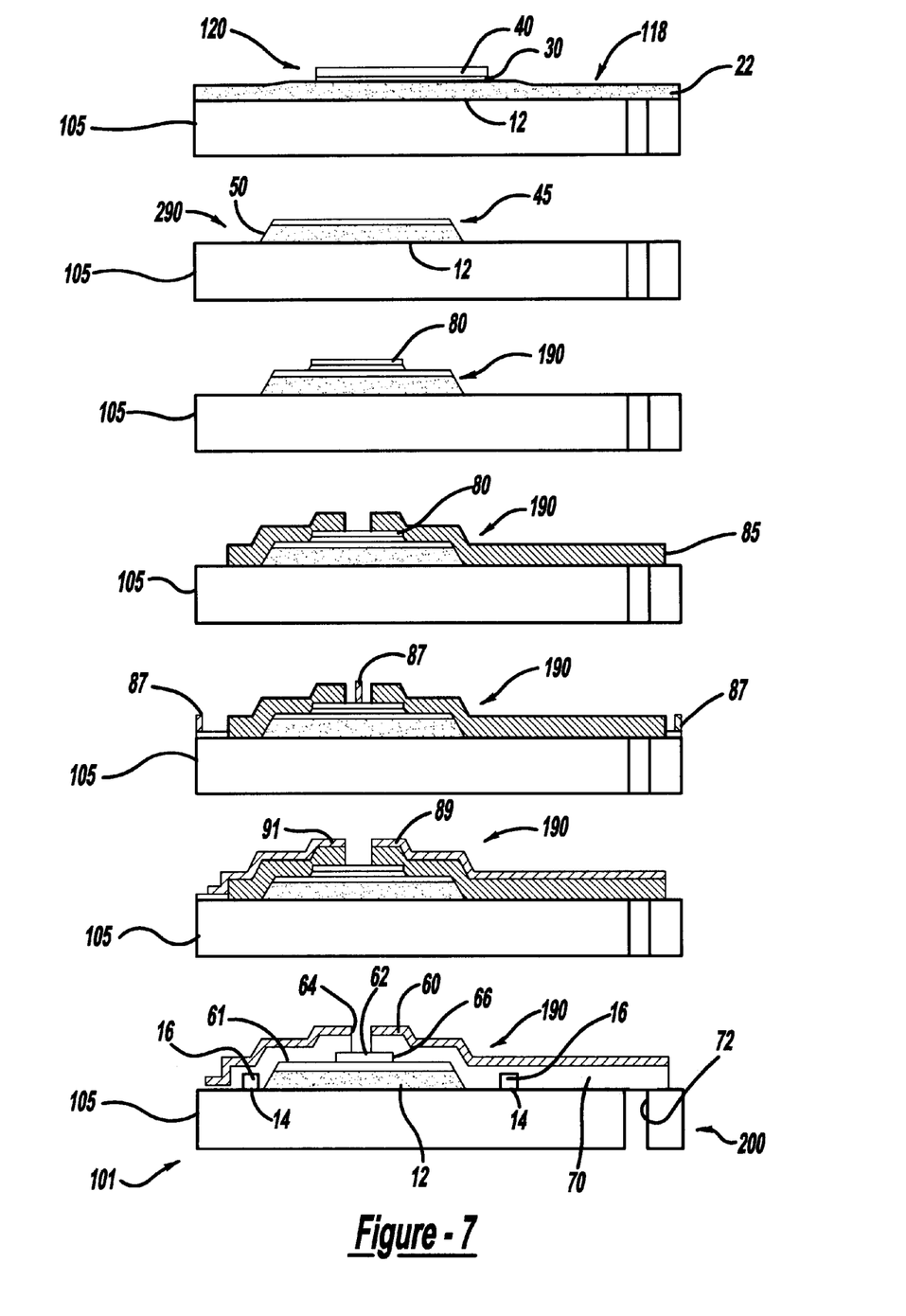
FIG. 7 is a simplified fabrication flow chart for a blocking microvalve according to FIG. 6.

The fabrication of the reservoir 60 and the channel 70 will now be described in detail. A sacrificial gap-setting layer 80 is evaporated and deposited on the top of the actuator portion. The thickness of the layer 80 will depend on the desired deflection capabilities of an actuator 190 for this application, as will be discussed. A 2 µm gap has been chosen based on the actuator deflection characteristics. The channel portion 70 and the reservoir portion 61 are formed by spin coating a 20 µm thick third resin layer 85. For example, the resin layer 85 may be a photoresist layer available from Clariant No 9260. After spin coating, the layer 85 is softbaked at 65° C. for one hour, followed by exposure at 5 m W/cm² for 400 seconds and lithograph developed, for example, in a 1:4 Clariant No AZ 400K:DIH₂O mixture for five minutes. The photoresist serves as a mold for forming the microfluidic channels. The entire substrate is then sputter coated with a 300/3000 Å thick electroplating seed layer 89 of, for example, Ti/Au. A 3 µm thick metal layer 91 is electroplated onto the seed layer 89. Preferably the metal layer 91 is nickel or Ni. This is followed by a spin casting, exposure and lithograph development of a fourth resin layer 87 to form an electroplating mold. This is followed by electroplating the channel structures. Next, the fourth resin layer 87 is removed by acetone and the Ni base layer 91 is etched with a commercially available metal etchant. The seed layer 89 is then wet etched using a commercial etchant that does not significantly attack the metal layer 91. For example, a seed layer using Ti/Au is etched with an Au etchant. One such Au etchant is available as GE-8148 from Transene Co., Inc. The Ti layer is removed with a dilute HF mixture made of 10:1 DIH₂O:Fh (49%). The sacrificial spacer layer 80 is removed using an etching solution of $K_4$ Fe $(CN)_6$ $3H_2O$:NaOH:DIH₂O. The front side of the substrate is spin coated with a thick layer of resin available, for example, as Clariant AZ 9260 and soft baked for one hour. Any thermoplastic such as parylene-C on the backside of the substrate (from previous dispositions) is removed using, for example, an $O_2$ RIE apparatus. The substrate 105 is wet etched with the dilute HF solution to form the inlet hole 72 while at the same time dicing the wafer. The reservoir portion 61 is removed in an acetone bath for five hours. Thus a blocking microvalve device is formed for pneumatic applications. A simplified fabrication process for the microvalve device 200 is shown in FIG. 7.

Figure 8:
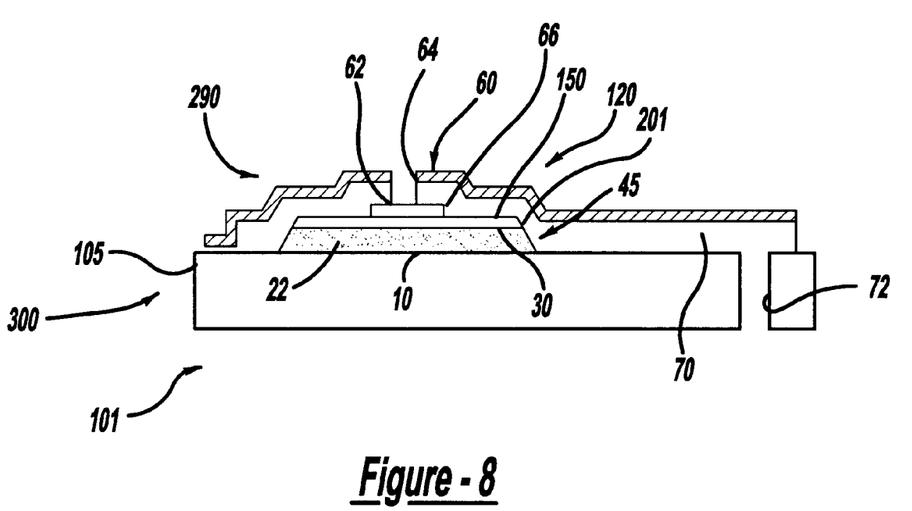
FIG. 8 is a cross sectional view of a microfluidic blocking valve according to the third embodiment of the invention.

A third embodiment of a micromachined device is a microvalve 300 used for liquid applications. An actuator 290 is fabricated using the same process and structure as described in the second preferred embodiment 200 except that a metallisized diaphragm member 150 is used. The metallisized diaphragm member 150 is formed with a 2 μm thick layer of thermoplastic such as parylene-C, and includes a layer of metal such as electroplated Ni. The gap height 66 between the diaphragm member 150 and the outlet port 64 is set by the thickness of the sacrificial thermoplastic photoresist layer 80 formed, for example, with Clariant AZ 9260. Due to the height difference between the substrate 105 and the diaphragm member 150 on the actuator 101, the layer 80 is thinner on top of the actuator 101. The layer 80 is 12 μm in the channels while on the top of the actuator 101 it is 6 μm thick. The sacrificial thermoplastic layer 80 is then patterned to form the reservoir 60 and the channel 70. Next, a 15 μm-thick layer of thermoplastic, for example parylene-C, is vacuum deposited. A metal mask layer is sputter coated. The mask layer may be, for example, Ti/Au that is 500/5000 Å thick. The metal mask layer is patterned and the thermoplastic layer is etched in an $O_2$ RIE to form the microvalve 300 as shown in FIG. 8.

In operation, the microvalve permits fluid to move through the inlet hole 72 into the channel 70, then past the actuator 101, through the valve seat 62 and out through the outlet port 64 and into the reservoir 60. The reservoir 60 has a valve seat 62 which is located above the actuator 101. A gap height 66 is between the valve seat 62 and the top of the diaphragm member 50, 150. The diaphragm member 50, 150 is designed to deflect at least 10% more than the gap height so as to form a seal on the bottom of the valve seat 62 to prevent fluid flow past the valve seat 62 and into the outlet port 64 and out of the microvalve 200, 300.

When the actuator 190 is unenergized, there will be a gap height 66 between the diaphragm member 50, 150 and the valve seat 62. When the actuator 190 is energized by power, the HAPP expands and the diaphragm member 50, 150 deflects. As the power to the actuator 190 increases, the diaphragm member 50, 150 deflects to sealingly engage the valve seat 62 and prevent the flow of fluid past the valve seat 62. When the actuator 190 is de-energized, the HAPP returns to its original volume and the diaphragm member 50, 150 disengages the valve seat 62 and returns to its original position thereby reforming a gap height 66 with the bottom of the valve seat 62.

Two types of actuators were fabricated using the fabrication process described above. The first device consisted of a 9 μm-thick circularly patterned HAPP layer covered with a 2 μm-thick metallisized p-xylylene diaphragm. Devices 200–400 μm in radius produced a 2.7 μm peak deflection. The second device included a constrained volume reservoir that magnified the diaphragm deflection. The device produced a 2.1–3.1 μm deflection with a HAPP thickness of only 3 μm.

Actuators were constructed on both glass and silicon substrates. Glass devices were powered with 50–200 mW of power showed response times in the range of 30–50 ms. The response time for silicon devices was much faster in the range of 3–5 ms but at the expense of greater actuation power that is between 0.5–2 W of power.

Alternatively, manufacture of microactuators or microvalves could also be fabricated at a temperature other than the temperature of use. For example, manufacture temperatures higher or lower than the temperature of use can be employed to take advantage of the properties of specific HAPP materials during manufacture.

While the invention has been described for a particular embodiment, it will be evident to those skilled in the art that numerous variations of the details may be made without departing from the spirit and teachings of the invention as defined in the drawings and the appended claims.

What is claimed is:

1. A micromachined device adapted to be energized by electrical power, said device comprising:
    a substrate member;
    a heater portion formed on said substrate member, said heater portion and said substrate member forming a first portion;
    a second portion adjacent to said first portion and forming a thermal expansion portion, said second portion including a HAPP portion, at least one resin layer and a shield member; and
    a diaphragm member encapsulating said thermal expansion portion so that when power is applied to said heater portion, said HAPP layer expands against said diaphragm member and said diaphragm member deflects.

2. The device as claimed in claim 1 further comprising:
    a reservoir adjacent to said diaphragm member, said reservoir having an outlet port, said diaphragm member deflecting to operatively engage said outlet port.

3. The device as claimed in claim 1 wherein said diaphragm includes a surface area and further comprises a plurality of posts disposed in said thermal expansion portion, said plurality of posts defining a region in said surface area to enhance the deflection of said diaphragm member in said region.

4. The device as claimed in claim 1 further comprising:
    at least one contact on said substrate member, said at least one contact connected to said heater portion.

5. The device as claimed in claim 1 wherein said substrate member is selected from a group consisting of silicon and glass.

6. The device as claimed in claim 1 wherein said HAPP portion is selected from polymers consisting of n-Alkanes and polyethylene.

7. The device as claimed in claim 1 wherein said resin layer is formed of a thermoplastic material.

8. The device as claimed in claim 1 wherein said shield member is formed of a metal alloy.

9. The device as claimed in claim 1 wherein said diaphragm member is formed of a material selected from a metallisized thermoplastic and a polymer.

10. The device as claimed in claim 1 wherein said heater portion is formed of a material selected from Cr/Au alloy, Aluminum, Gold, Copper and Silver.

11. A process for forming a micromachined device, said device being activated by power, said process comprising:
    providing a substrate;
    forming a heater portion on said substrate, said heater portion and said substrate forming a first portion;
    constructing a second portion adjacent said first portion, said second portion including a HAPP layer, at least one resin layer on said HAPP layer and a mask on said resin layer;

shaping said second portion to form a thermal expansion portion; and encapsulating said thermal expansion portion with a diaphragm member so that when the power is applied to said heater portion, said HAPP layer expands against said diaphragm member and said diaphragm member deflects.

12. The process as claimed in claim 11 further comprising:

forming at least one contact on said substrate, said at least one contact connected to said heater portion.

13. The process as claimed in claim 11 further comprising:

forming a reservoir adjacent to said diaphragm member, said reservoir having a valve seat, said valve seat being spaced away from said diaphragm member, whereby when power is applied to said heater portion, said HAPP layer expands against said diaphragm member and said diaphragm member deflects to operatively engage said valve seat.

14. The process as claimed in claim 11 further comprising:

disposing a plurality of posts in said thermal expansion portion, said plurality of posts defining a region, the deflection of said diaphragm member being enhanced in said region.

15. The process as claimed in claim 11 wherein said HAPP layer is formed of a long chain polymer material.

16. The process as claimed in claim 11 wherein said at least one resin layer is formed of a photoresist material.

17. The process as claimed in claim 11 wherein said mask is formed of a Cr/Au material.

18. The process as claimed in claim 11 wherein said diaphragm member is formed of a material selected from a metallisized thermoplastic and a polymer.

19. The process as claimed in claim 11 wherein said diaphragm member is formed of one of a parylene layer and a nickel layer deposited on a parylene layer.

20. The process as claimed in claim 11 wherein said heater portion is formed of a material selected from the group consisting of Cr/Au alloy, Aluminum, Gold, Copper and Silver.

21. The process as claimed in claim 11 wherein said forming step includes evaporating and patterning said heater portion on said substrate.

22. The process as claimed in claim 11 wherein said constructing step includes evaporating and depositing said HAPP layer.

23. The process as claimed in claim 11 wherein said at least one resin layer is thermoplastic.

24. The process as claimed in claim 11 wherein said mask is wet etched to form a hard physical mask.

25. The process as claimed in claim 11 wherein said shaping step includes selectively patterning said second portion in $O_2:CF_4$ plasma.

26. The process as claimed in claim 12 further comprising:

etching a contact hole in said substrate, and said forming step includes evaporating and patterning said at least one contact in said contact hole.

27. The process as claimed in claim 11 wherein said encapsulating step includes depositing a thermoplastic layer on said HAPP layer.

28. The process as claimed in claim 15 wherein said long chain polymer material is selected from an n-Alkane polymer.

29. The process as claimed in claim 11 wherein said HAPP layer is selected from an n-Alkyl group consisting of n-tetracosane, n-hexatriacontane and n-tetratetracontane.

30. The process as claimed in claim 11 wherein said heater portion includes evaporating and patterning Cr/Au on said substrate.

31. A micromachined device formed on a substrate member and adapted to be energized by power, said device comprising:

a heater portion formed on the substrate member, said heater portion and the substrate member forming a first portion;

a HAPP layer adjacent to said heater portion;

at least one resin layer adjacent to said HAPP layer;

a mask adjacent to said resin layer, said HAPP layer, said resin layer and said mask forming a second portion, said second portion being selectively shaped to form a thermal expansion portion;

a diaphragm member encapsulating said thermal expansion portion;

a channel formed in the substrate;

a reservoir adjacent to an actuator member, said reservoir having a valve seat, said valve seat being spaced away from said actuator member, whereby when power is applied to said heater portion, said HAPP layer expands against said diaphragm member and said diaphragm deflects to engage said valve seat.

32. The device as claimed in claim 31 further comprising:

a plurality of posts formed in said HAPP layer, said plurality of posts defining a region adjacent to said diaphragm member to enhance the deflection of said diaphragm member.

33. The device as claimed in claim 31 further comprising:

at least one contact on the substrate member, said at least one contact connected to said heater portion.

34. The device as claimed in claim 31 wherein the substrate member is selected from a group consisting of silicon and glass.

35. The device as claimed in claim 31 wherein said HAPP layer is selected from polymers consisting of n-Alkanes and polyethylene.

36. The device as claimed in claim 31 wherein said at least one resin layer is formed of a thermoplastic material.

37. The device as claimed in claim 31 wherein said diaphragm member is formed of a material selected from metallisized thermoplastic and a polymer.

38. The device as claimed in claim 31 wherein said mask is formed of a metal alloy.

39. The device as claimed in claim 31 wherein said heater portion is formed of a material selected from Cr/Au alloy, Aluminum, Gold, Copper and Silver.

40. The device as claimed in claim 31 wherein said device forms a normally open valve to control fluid in said channel.

* * * * *